United States Patent
Fischer et al.

(10) Patent No.: US 6,876,048 B2
(45) Date of Patent: Apr. 5, 2005

(54) MICROMECHANICAL COMPONENT AS WELL AS A METHOD FOR PRODUCING A MICROMECHANICAL COMPONENT

(75) Inventors: Frank Fischer, Gomaringen (DE); Peter Hein, Reutlingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 272 days.

(21) Appl. No.: 10/066,851

(22) Filed: Feb. 4, 2002

(65) Prior Publication Data

US 2003/0001221 A1 Jan. 2, 2003

(30) Foreign Application Priority Data

Feb. 3, 2001 (DE) .......................................... 101 04 868

(51) Int. Cl.⁷ .......................... H01L 27/14; H01L 29/82; H01L 29/84
(52) U.S. Cl. .......................... 257/417; 257/414; 257/415
(58) Field of Search ................................ 257/414, 415, 257/417; 438/50–53

(56) References Cited

U.S. PATENT DOCUMENTS

| 5,164,338 A | * 11/1992 | Graeger et al. ............... 438/50 |
| 5,312,296 A | * 5/1994 | Aalto et al. .................... 454/66 |
| 5,343,064 A | * 8/1994 | Spangler et al. ............ 257/350 |
| 5,521,428 A | 5/1996 | Hollingsworth et al. |
| 5,595,939 A | * 1/1997 | Otake et al. .................. 438/51 |
| 5,852,320 A | * 12/1998 | Ichihashi .................... 257/419 |
| 6,077,721 A | * 6/2000 | Fukada et al. ................ 438/53 |
| 6,201,284 B1 | * 3/2001 | Hirata et al. ................ 257/415 |
| 6,407,437 B1 | * 6/2002 | Burger et al. ............... 257/415 |
| 6,663,789 B2 | * 12/2003 | Hara ............................ 216/24 |
| 6,683,358 B1 | * 1/2004 | Ishida et al. ................ 257/417 |

FOREIGN PATENT DOCUMENTS

| DE | 39 14 015 | 10/1990 |
| DE | 40 06 108 | 8/1991 |
| DE | 195 37 814 | 4/1997 |
| FR | 2 763 745 | 11/1998 |

OTHER PUBLICATIONS

L. B. Wilner, "A High Performance, Variable, Capacitance Accelerometer", IEEE Transactions On Instrumental And Measurement, IEEE Inc., NY, US, Bd. 37, Nr. 4, Jan. 12, 1998, pp. 569–571.

T. J. Brosnihan et al., Embedded Interconnect and Electrical Isolation For High–Aspect–Ratio, SOI Inertial Instruments, Transducers '07, 1997 International Conference on Solid-State Sensors and Actuators, Chicago, Jun. 16–19, 1997, pp. 637–640.

* cited by examiner

Primary Examiner—Alexander Ghyka
(74) Attorney, Agent, or Firm—Kenyon & Kenyon

(57) ABSTRACT

A micromechanical component having a substrate beneath at least one structured layer, in the structured layer at least one functional structure being formed, a cap which covers the functional structure, between the cap and the functional structure at least one cavity being formed, and a connecting layer which connects the cap to structured layer, as well as a method for producing the micromechanical component. To obtain a compact and robust component, the connecting layer is formed from an anodically bondable glass, i.e. a bond glass, which has a thickness in the range of 300 nm to 100 μm, which may in particular be in the range of 300 nm to 50 μm.

18 Claims, 6 Drawing Sheets

MICROMECHANICAL COMPONENT AS WELL AS A METHOD FOR PRODUCING A MICROMECHANICAL COMPONENT

FIELD OF THE INVENTION

The present invention relates to a micromechanical component, and a method for producing a micromechanical component.

BACKGROUND INFORMATION

German Published Patent Application No. 195 37 814 describes the construction of a sensor layer system and a method for the hermetic encapsulation of sensors in surface micromechanics.

SUMMARY OF THE INVENTION

A cost-effectively produced compact and long-term stable micromechanical component characterized by a robust layer construction and by a clear reduction of the area needed for the encapsulation.

The present invention concerns a cap that covers functional structures, the cap being connected with the structured layer with the aid of an anodically bondable glass or a bond glass. According to one exemplary embodiment and/or exemplary method of the present invention, the connecting layer may be formed by the anodically bondable glass having a thickness in the range of 300 nm to 100 $\mu$m, especially a thickness in the range of 300 nm to 50 $\mu$m. By the use of the anodically bondable glass, a mechanically stable connection may be produced in a simple manner between the cap and the structured layer using a small connecting area. A considerable savings in area or a considerably improved wafer utilization may be achieved, particularly in mass production where the micromechanical component may be formed more than one thousandfold on one wafer or substrate.

According to another exemplary embodiment and/or exemplary method according to the present invention, by choosing an anodically bondable glass having a thickness in the range of 300 nm to 100 $\mu$m, or especially making it from a thicker glass wafer, one may cut the micromechanical components formed on a wafer into single pieces, using one single saw cut through the entire layer construction of the micromechanical component. This is possible because a customary saw blade for cutting out micromechanical components from the wafer may also cut through the anodically bondable glass of the noted thickness without damaging the saw blade or the component. Without the present invention, it may be necessary to make a saw cut down to the connecting layer using a first saw blade, to cut through the connecting layer using a second saw blade, and after that, to cut completely through the micromechanical component, or rather cut it into individual pieces, using the first saw blade again.

According to another exemplary embodiment and/or exemplary method of the present invention, a bond glass may be used, which has a specified ion concentration so as to be anodically bondable. Glasses which may be used as bond glasses include ones which have alkali silicate and/or borosilicate.

According to yet another exemplary embodiment and/or exemplary method of the present invention, a terminal area may be provided for external contacting of the functional structures in the substrate of the micromechanical component. The terminal area may be electrically insulated from the substrate by an insulating frame formed by trenches. The terminal area may be provided directly next to or even under a supporting element in the substrate, in order to minimize, especially for reasons of cost, the substrate area or volume required for the micromechanical component.

External contacting of the functional structures is achieved via a funnel-shaped opening, provided in the cap, which expands away from the functional structures. In such an external contacting, the sawing sludge created during sawing, or rather the cutting into individual pieces of the micromechanical components from the wafer, may get into the funnel-shaped access opening. Considerable effort may be needed to clean the funnel-shaped access opening of the sawing sludge. Any remains of sawing sludge that are not washed out may lead to shunting, which may lead to the malfunctioning of the respective micromechanical component.

By dint of the terminal area for the external contacting of the functional structures being created in an exemplary manner according to the present invention in the substrate, a method of plasma etching or trench etching may be used, particularly with a substrate thickness in the range of ca 80 $\mu$m to 150 $\mu$m, for example, ca 80 $\mu$m to 100 $\mu$m. Hereby, narrow, deep trenches may be produced for the formation of an insulating frame, which may extend largely perpendicularly from the underside of the substrate up to the functional layer. Selection of the substrate's thickness may be oriented to the required stability of the micromechanical component and to the maximum possible depth of the trenches, down to which narrow trenches may be produced, for example, by trench etching. These trenches, or rather the insulating frame formed by the trenches, may be closed by a dielectric in the area on the underside of the substrate, which electrically insulates the terminal area from the substrate while forming a part of the substrate.

According to another exemplary embodiment and/or exemplary method of the present invention, a blind hole may be formed by etching, which proceeds largely vertically through the substrate, the structured layer, and the connecting layer right up to the cap, where the floor of the blind hole is in the region of the cap, and the opening of the blind hole is on the side of the substrate opposite the functional structures. The blind hole or the passage at its floor area and on its wall areas may be provided with a conducting layer, so that an electrical connection may be made between the cap, the structured layer, and the substrate. The blind hole or the passage may be completely filled with a filler layer after production of the conducting layer. By putting the conducting layer at a definite electrical potential, at ground for example, potential differences between the cap, the structured layer, and the substrate, and thus, potential interference voltages, may be avoided.

If the mechanical stability of the micromechanical component is not sufficient, at least one supporting element may be provided between the substrate and the cap, the supporting element may be formed by etching of the functional layer, and may be largely at the center of the cavity covered by the cap.

An exemplary method according to the present invention may be used to produce a micromechanical component in which the structured layer, which has functional structures, may be connected to a cap via a connecting layer. The material of the connecting layer may be selected in such a way that chemical bonding is brought about, by the application of an electrical voltage between the substrate and the cap of the micromechanical component, between the connecting layer and the structured layer, as well as between the connecting layer and the cap where a bond may be formed at the edge region of the cavity formed between the cap and the functional structures (anodic bonding). For this, at least the bonding region may be heated. The bonding of the cap and the side of the bonding layer facing the cap may take place in a first step, and the bonding between the structured layer and the side of the connecting layer facing the structured layer may take place in a second step.

The bonding locations may be pretreated chemically and/or mechanically before anodic bonding in such a way that they have a slight surface roughness quantifiable as approximately 40 nm or less. Finally, the component may posses a low topography, whereby, for example, the component may be installed using the so-called flip-chip technique.

BRIEF DESCRIPTION OF THE DIAGRAMS

DETAILED DESCRIPTION

Figure 1:
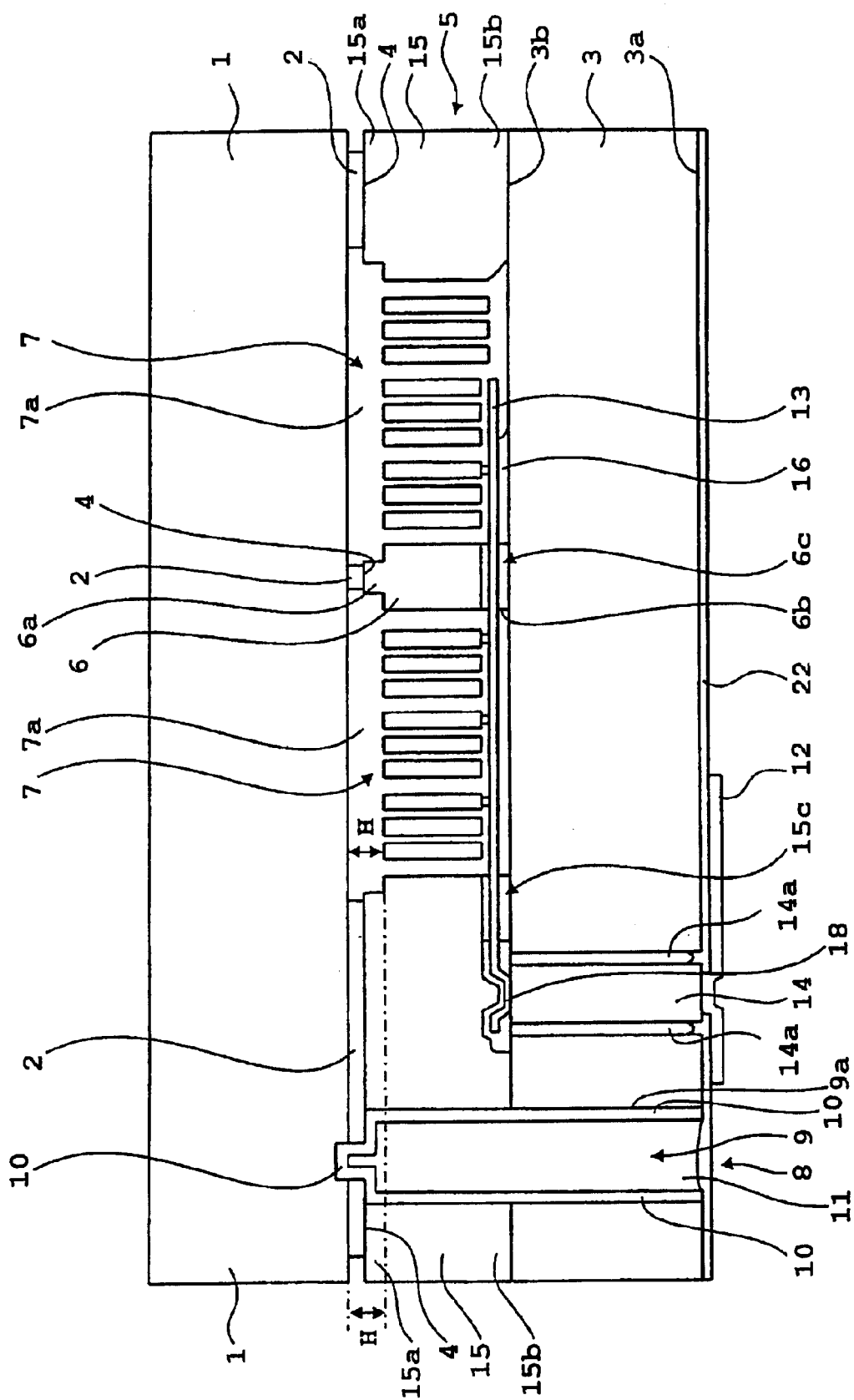
FIG. 1 shows a cross section of an exemplary embodiment of a component according to the present invention having a substrate, a structured layer, and a cap.

FIG. 1 shows an exemplary embodiment of a component according to the present invention, such as an acceleration sensor, in cross section. A structured layer 5, in which functional structures 7 and supporting structures are formed, is positioned on a substrate 3. In the exemplary embodiment, the functional structures 7 are formed in the structured layer 5 as meshing combs or interdigital structures having fixed and deflectable electrodes. The supporting structures are formed by a frame 15, which surrounds functional structures 7, and a supporting element 6, which is positioned inside frame 15 in the area of functional structures 7, and may contribute to the mechanical stability of the layer system. In the exemplary embodiment of FIG. 1, only a supporting element 6 is illustrated, which is positioned between the two functional structures 7 shown. However, depending on the required mechanical stability of the component, provision may also be made, in the region of the functional structures, for no supporting element, a single supporting element 6, or a plurality of supporting elements spaced at a distance from one another. Expediently, the supporting element or supporting elements may be positioned in such a way that the freedom of motion of functional structures 7 is not impaired.

An approximately planar cap 1 is connected to supporting structures 6 and 15 of structured layer 5 via a connecting layer 2, and overlaps functional structures 7. Supporting structures 6 and 15 are developed raised in comparison with functional structures 7 (cf FIG. 3), and project above functional structures 7, for example, by about 4–10 μm, so that cavities 7a form in the region of functional structures 7 or open up between functional structures 7 and cap 1, respectively.

Alternatively or supplementary to the exemplary embodiment shown in FIG. 1, a depression may be provided in the region of the functional structures on the underside of the cap, i.e. on the side of the cap facing functional structures 7, so that the depression forms the cavity or cavities 7a above functional structures 7 in whole or in part (not shown).

Connecting layer 2 is removed in the region of functional structures 7, so that the height of the gap H of cavities 7a becomes correspondingly greater. Expediently, the height of the gap H of cavities 7a may be such that a destructive deflection of functional structures 7 in the vertical direction, i.e. in the z direction, is prevented. The total gap range of cavities 7a in the lateral direction may lie between about 100 and 500 μm. However, gap widths up to several mm are also possible.

At first ends 6a and 15a, of supporting element 6 and of frame 15, associated with cap 1, connecting areas 4 for connecting to connecting layer 2 are formed. Connecting areas 4 may have a width of less than 150 μm and a high surface quality or rather, a low surface roughness, which may amount to approximately 40 nm or less. Supporting element 6 and frame 15 are connected at their other ends 6b and 15b to substrate 3.

Between substrate 3 and structured layer 5 printed circuit traces 13 are provided which may be used for the external contacting of functional structures 7. Printed circuit traces 13 are placed closely underneath functional structures 7, and run through duct areas 6c and 15c of supporting structures 6 and 15, two sacrificial layers 16 and 17 (see FIG. 2) insulating printed circuit traces 13 from supporting structures 6 and 15.

In addition, for external contacting of functional structures 7, a terminal area 14 is formed in substrate 3, for the most part directly next to functional structures 7, which is located at upper side 3b of substrate 3 facing structured layer 5, in direct contact with contact reed 18 of printed circuit traces 13. Terminal area 14 is completely surrounded by trenches 14a, which form an insulating frame. Trenches 14a extend from the substrate's underside to the substrate's upper side, so that terminal area 14 formed thereby may be electrically insulated from substrate 3. Trenches 14a may have a high aspect ratio, i.e. great depth and a slight lateral dimension size. A metallic coating 12 is applied to terminal area 14 on its backside 3a of substrate 3 facing away from structured layer 5, which may form a printed circuit trace and a contact pad for fastening bonding wire, via which an external electrical connection to functional structures 7 is produced. Metallic coating 12 is insulated from substrate 3 at backside 3a of substrate 3 by a dialectric layer 22.

Metal coating 12, and thus the printed circuit trace and the contact pad may extend from terminal area 14 horizontally in the direction of functional structures 7, whereby the wafer area and substrate area, respectively, required for the production of the component may be reduced in a cost-saving manner.

According to one exemplary embodiment (not shown), terminal area 14 for external contacting of functional structures 7 may be produced largely centrically below supporting element 6. This may lead to savings in wafer area and substrate area required for producing the component, which is consistent with a cost-saving reduction in volume of the component. Packing density may also be increased.

Furthermore, between substrate 3, structured layer 5, and cap 1, a conductive connection 8 is provided, in order to avoid differences in potential between the substrate and cap 1. Conductive connection 8 includes a blind hole or rather, a passage 9, which extends outside the region of printed circuit traces 13 through substrate 3, frame 15 and into a part of cap 1. A conductive layer 10, for example a metallic layer, which is positioned on the bottom and the wall surfaces 9a of passage 9, connects substrate 3, structured layer 5 and cap 1. A filler layer 11 closes passage 9 on the backside 3a of substrate 3, and evens out the topography.

Figure 2:
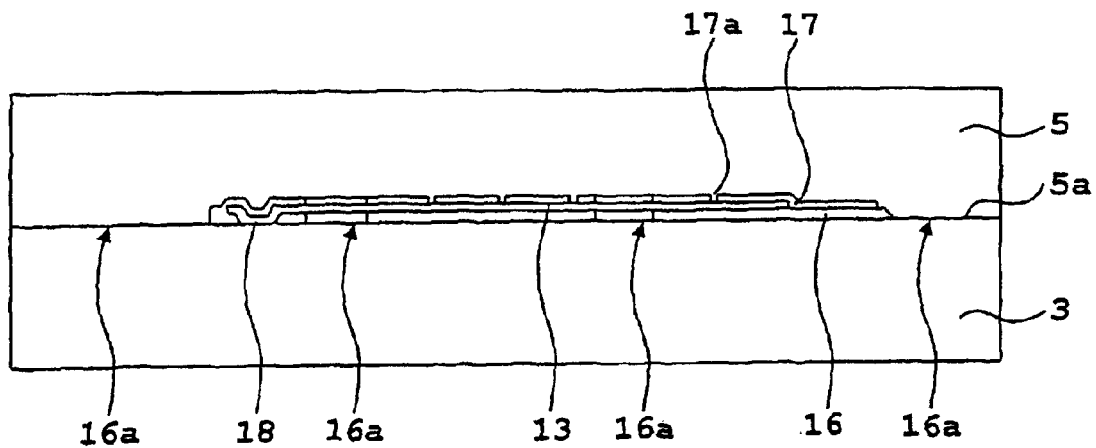
FIGS. 2 through 10 show an exemplary method according to the present invention for producing the component illustrated in FIG. 1.

FIGS. 2 through 10 describe an exemplary method for producing the component illustrated in FIG. 1. The layer construction of the component is shown in FIG. 2 as it looks before the depth structuring of structured layer 5. On substrate 3, which may be made of monocrystalline silicon, a first sacrificial layer 16 is applied which may be made, for instance, of one or more $SiO_2$ layers. On first sacrificial layer 16 printed circuit traces 13 are deposited, made of polycrystalline silicon, which may be sufficiently strongly doped for the purpose of achieving as high as possible a conductivity. First sacrificial layer 16 is prestructured before the application of the printed circuit traces 13, a contact opening for correspondingly formed contact reed 18 being etched into first sacrificial layer 16 for each of the printed circuit traces 13. Each of contact reeds 18 borders directly on substrate 3 and is directly connected to terminal area 14 formed later in each case in substrate 3. The production of the terminal areas described and their respective external contacting (not illustrated) may be carried out in the same way as the production and external contacting of the explicitly illustrated terminal area 14.

A second sacrificial layer 17, similarly made of of $SiO_2$, is deposited on printed circuit traces 13, and functions as an insulating layer. CVD [chemical vapor deposition] methods may be used for the production of the second sacrificial layer 17, such as when using tetraethyl orthosilicate (TEOS). Then, on second sacrificial layer 17, a thin polysilicon starter layer 5a is deposited, i.e. a polycrystalline silicon layer having the function of a seeding or nucleating layer. On starting polysilicon layer 5a a polycrystalline silicon layer, which represents the subsequently formed structured layer 5, is deposited, using an epitaxial method, the starting polycrystalline layer merging into the upper polycrystalline layer. The surface of upper polycrystalline layer 5 is leveled in a further process step. A chemical-mechanical polishing process (CMP) may be used to achieve a surface roughness which allows the surfaces to connect or anodically bond well with connecting layer 2 by the application of a voltage difference. The surface roughness in this case may amount to ca 2 nm to ca 50 nm.

Sacrificial layers 16 and 17 are expediently structured before the deposition of starting polysilicon layer 5a. In this case, first and second sacrificial layers 16 and 17 are partially or completely removed in regions 16a, in which supporting structures 6 and 15 are formed in a later process step, so that supporting structures 6 and 15 are directly connected to the substrate. In second sacrificial layer 17, contact openings 17a are formed for contacting functional structures 7 to printed circuit traces 13.

Figure 3:
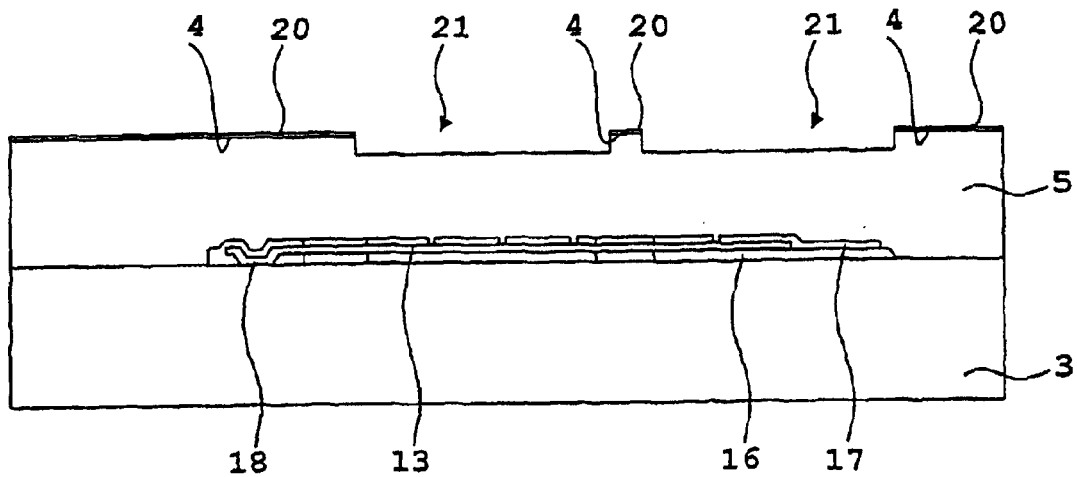

As shown in FIG. 3, an oxide mask 20 is deposited on connecting surfaces 4 by a CVD method, connecting surfaces 4 being located in the area of supporting structures 6 and 15 which are formed later. Oxide mask 20, precipitated from the gas phase, is used as a passivating layer on account of its good $Si/SiO_2$ selectivity, and ensures that connecting surfaces 4 are not attacked by a later plasma etching step or a chemical-mechanical polishing process (CMP). Using a dry etching method or an additional CMP step, planar recesses are etched or formed in regions 7 of structured layer 5, in which functional structures 7 are structured later. Oxide mask 20 is subsequently removed.

Alternatively or in supplement to the exemplary method of FIG. 3, one or more recesses (not illustrated) may be produced at the underside of the cap, for the complete or partial formation of the cavity above the functional structures, for example, by plasma etching.

In the exemplary process step described above, supporting structures 6 and 15 are prestructured opposite functional structures 7, with respect to their height (and possibly with respect to their width), by thinning structured layer 5 in the areas of functional structures 7 by a specified quantity.

Alternatively, in order to make supporting structures 6 and 15 higher, a connecting layer may be used having a correspondingly greater thickness dimension (case not shown).

If one or more recesses may be provided at the underside of the cap, they may be structured in such a way that the recess(es) has(have) one or more supporting elements, which complement(s) one or more supporting elements of structured layer 5 (not illustrated).

Figure 4:
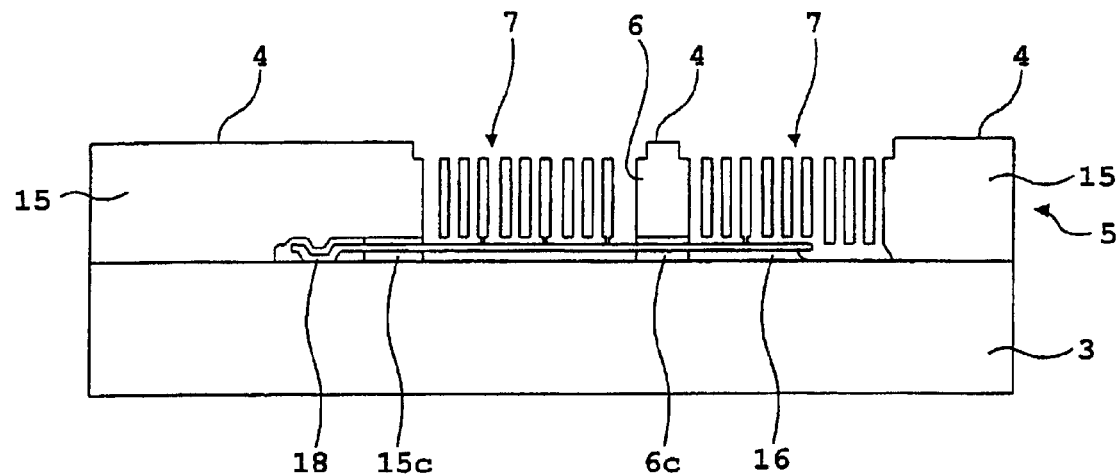

In a further exemplary process step shown in FIG. 4, functional structures 7 and supporting element 6 are structured using trench etching. Second sacrificial layer 17 and in part also first sacrificial layer 16 are removed below functional structures 7 using a gas phase etching method, so that deflectable structures are created.

Figure 5:
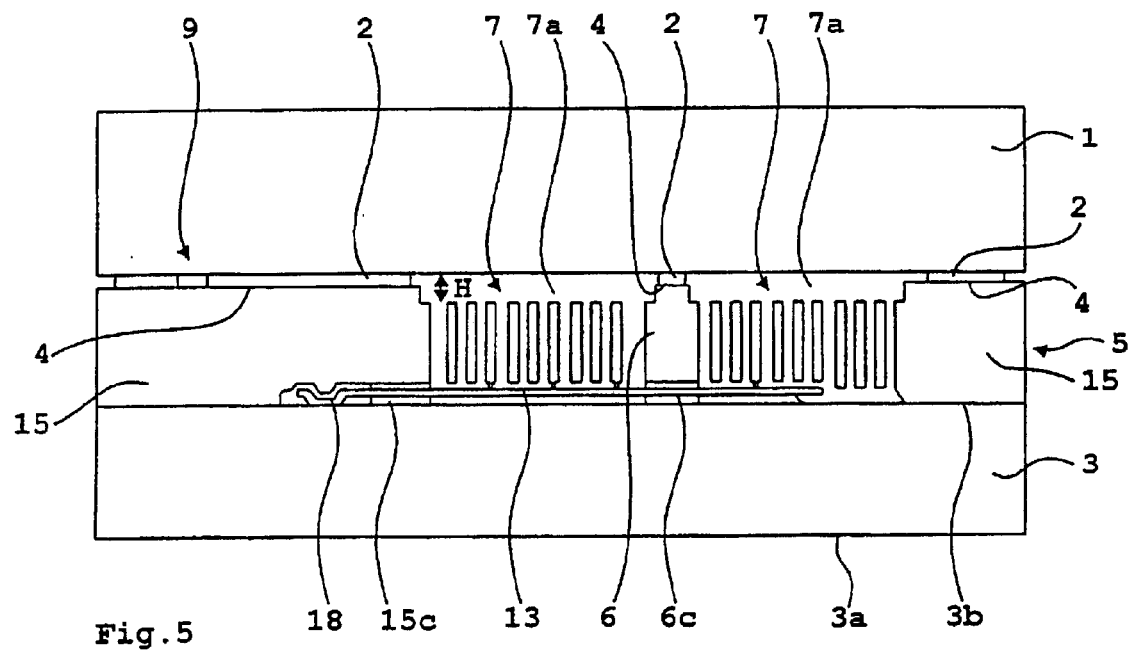

The hermetically sealed encapsulation of the component or rather, the sensor layer system, is performed in an exemplary central step, as shown in FIG. 5. Cap 1, which may be made of monocrystalline silicon, is here chemically bonded to connecting surfaces 4 of supporting structures 6 and 15, via connecting layer 2.

Connecting layer 2 may be made of a silicate glass about 10–50 $\mu$m thick, which may be produced by chemical and/or mechanical treatment from a thicker silicate glass wafer, for example, 500 $\mu$m in thickness. The silicate glass has a specified concentration of monovalent or higher-valent cations, such as $Na^+$ or $B^{3+}$, and a corresponding concentration of weakly bound oxygen atoms. Alkali silicates and borosilicates may be particularly suitable.

In order to be able to produce a high surface quality for the purpose of an optimum joint between cap 1 and connecting layer 2, cap 1 is chemically-mechanically polished on its side facing connecting layer 2. After the CMP step, the surface roughness is typically under 2 nm. Then, cap 1 is connected in a planar manner to connecting layer 2 by the application of a voltage difference between the cap and connecting layer 2, typically ca –150 to –1000 V, cap 1 being grounded. During the connecting step, a raised temperature of about 350–450° C. may additionally act on connecting layer 2, in order to increase the mobility of the metal or boron cations. The reduced cation concentration may be compensated for by a supplementary temperature action. Alternatively or in supplement, after connecting cap 1 to connecting layer 2, the supply voltage is reversed so as to compensate for the reduced concentration of cations that has been created at the boundary between connecting layer 2 and cap 1.

Alternatively, connecting layer 2 may be deposited on cap 1 in fused form, the melting or softening temperature, respectively, being in a range of 600–800° C., depending on the kind of silicate glass used. At this temperature range, chemical bonding between cap 1 and connecting layer 2 may also take place. After solidification, connecting layer 2 may be processed as described below.

After the bonding of cap 1 to connecting layer 2, connecting layer 2 is ground down roughly mechanically, or rather thinned down according to the above first or second alternative on the side facing connecting surface 4, and is subsequently polished in a CMP step in order to produce a good joint with connecting surfaces 4 of structured layer 5.

After this processing, connecting layer 2 has a thickness of about 10–50 $\mu$m, and a surface roughness of 2 nm or less.

Alternatively, the connecting layer may be deposited by sputtering of silicate glass, particularly using electron beam sputtering. Before that, the cap is oxidized thermally, whereby a ca 1 to 2 µm layer of silicon oxide layer is formed on which the connecting layer is deposited by sputtering. The silicon oxide layer improves the electrical voltage resistance during anodic bonding. For a connecting layer (alkali or borosilicate) formed by sputtering, layer thicknesses may be in the range of about 300 nm to 2 µm.

Connecting layer 2 is removed in the area of functional structures 7 in all three alternatives recited above, or is structured so as to increase the size of gap height H of cavities 7a.

Connecting layer 2 is also removed in the region of connecting passage 9, formed later, of conductive connection 8. In a further process step, the bonding of connecting surfaces 4 of structured layer 5 to connecting layer 2 takes place. Connecting surfaces 4 and connecting layer 2 are adjusted to each other and chemically connected (anodic bonding) by the supply voltage applied and/or under the action of temperature. For this step, a lower voltage is applied to cap 1 compared to that of the bonding of cap 1 to connecting layer 2, to prevent excessive deflection of functional structures 7 as a result of the bonding voltage. Typically, this may be −100 V at cap 1, substrate 3 being grounded.

During the encapsulation, a gas having a pressure between 1 mbar and 1 bar may be enclosed in cavities 7a, the damping of functional structures 7's movement being determined by the pressure. In a supplementary way, after encapsulation, a liquid may also be conveyed into cavities 7a via an opening that may be closed again, its viscosity determining the degree of the damping, or also a gas, or even a further gas.

The basic doping Of n-doped substrate 3 may be typically greater than $5*10^{15}/cm^3$, and the ohmic resistance less than ca 1 Ohm*cm (low-resistance). The doping of n-doped function layer 5 is approximately $10^{17}/cm^3$ to $10^{19}/cm^3$, which makes possible a low-resistance external contact to functional structures 7.

Using the anodic bonding method described above, a hermetically sealed connection is produced, on the one hand, between cap 1 and connecting layer 2 and, on the other hand, between connecting layer 2 and connecting surfaces 4 or structured layer 5. In this manner, relatively small connecting surfaces 4 are needed. For example, the width of the connecting surfaces is only about 30 to 150 µm.

Figure 6:
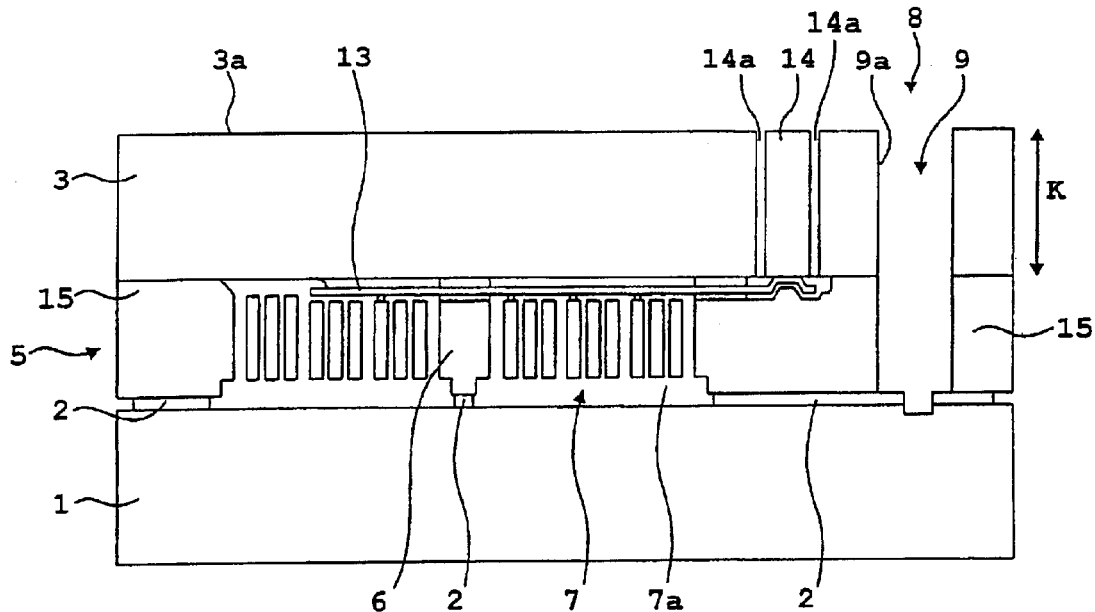

After the connection of cap 1 to connecting surfaces 4, there follows mechanical grinding back of backside 3a of substrate 3 (cf FIG. 6). This may take place in several steps: First backside 3a of substrate 3 is ground down coarsely abrasively, using a diamond grinding disk of large grain size, and subsequently using a diamond grinding disk of smaller grain size having correspondingly less material removal. Alternatively, the grinding down may also be performed in a single step. After finishing, the surface roughness amounts to about 0.1–1 µm, and the depth of crystal dislocation comes to about 3–5 µm.

The crystal dislocations are removed by a CMP process and the surface quality is thereby further improved. The material removal here amounts to about 10 µm. The crystal dislocations in substrate 3 may alternatively be removed by so-called spin etching. The material removal here typically amounts to 5 to 10 µm. After subsequent CMP leveling there may still be a material removal of typically 3 µm.

The residual thickness K of substrate 3 is selected in such a way that the static stability of the layer system is ensured, supporting elements 6 considerably improving the static stability. One may do without the supporting elements particularly when the gap widths are small. Typically, residual thickness K of substrate 3 may be about 80–150 µm.

In a further process step (cf FIG. 6) trenches 14a are formed for contact area 14 by trench etching. Furthermore, passage 9 is formed by a deep-etching method, passage 9 extending through substrate 3, structured layer 5 and partially into cap 1.

Figure 7:
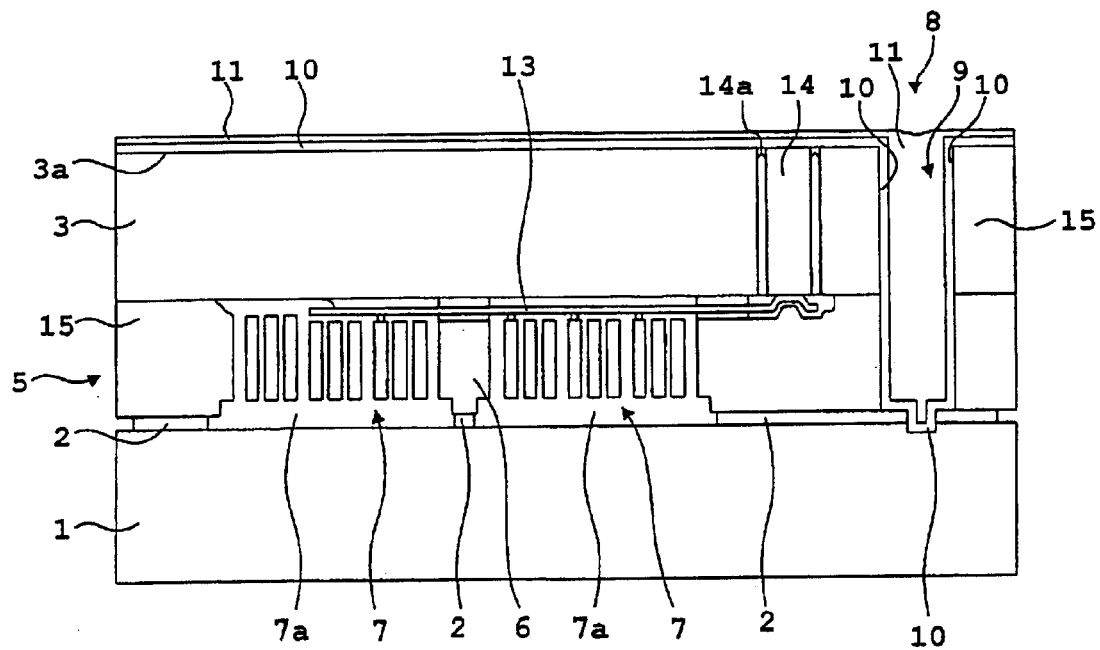

As illustrated in FIG. 7, conductive layer 10 is applied to bottom surface and wall surfaces 9a of passage 9, or rather, blind hole, by being deposited on the backside 3a of substrate 3. Conductive layer 10, which may be a metallic layer, for example, produces a low ohmic connection of substrate 3 to cap 1 and structured layer 5. Subsequently, a filler layer 11 is introduced into passage 9, or the blind hole, which closes passage 9 and evens out the surface topography. Filler layer 11 may be a silicon oxide layer which may be produced by a so-called spin-on method or by introducing and hardening a filler material containing silicon dioxide.

Figure 8:
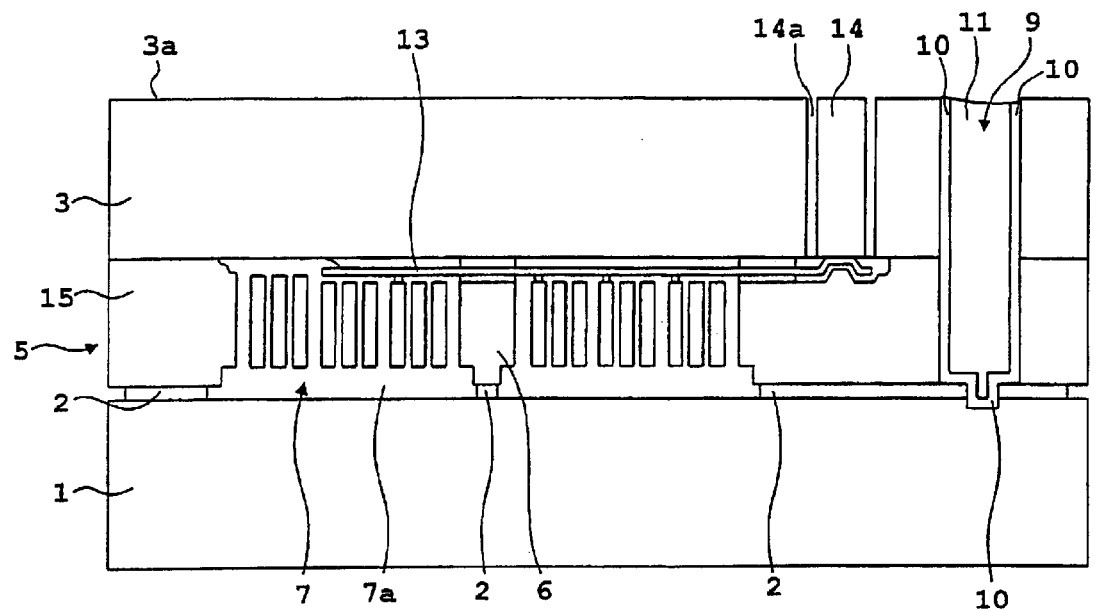

As shown in FIG. 8, filler layer 11 is etched back using a plasma etching method. Subsequently, on backside 3a of substrate 3 is removed by a wet-chemical process. Here care should be taken that conductive layer 10 is completely removed in the region of trenches 14a, and that in the region of passage 3 there is not excessively much overetching, so that no undesired topographies form.

Figure 9:
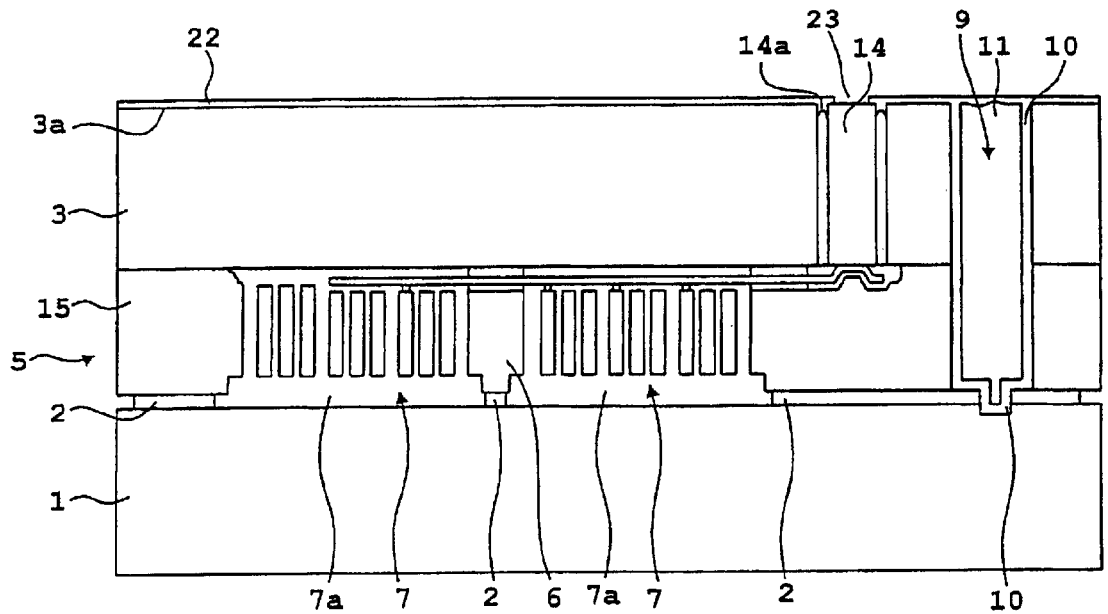
Figure 10:
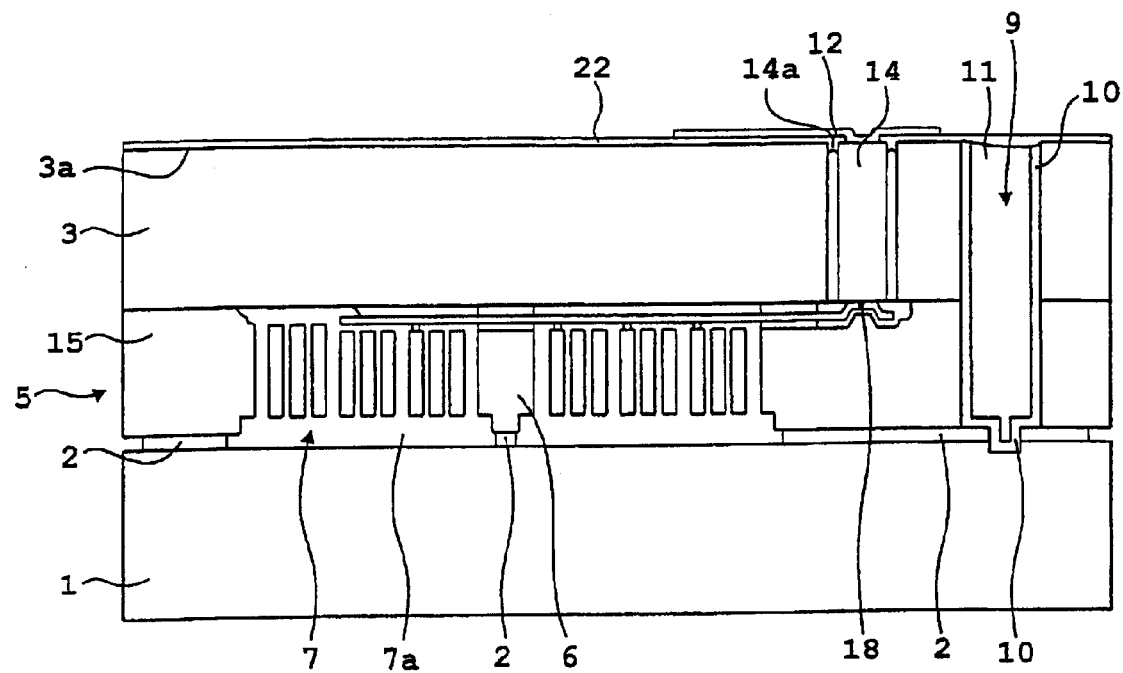

According to FIG. 9, dielectric layer 22 is deposited on backside 3a of substrate 3 by a CVD method. Dielectric layer 22 is used as insulating layer and insulates subsequently deposited metallic coating 12 from substrate 3. Near terminal area 14, a contact opening 23 is formed in dielectric layer 22, for the external contacting of terminal area 14. Subsequently, as shown in FIG. 10, metallic layer 12 is deposited on dielectric layer 22 and on terminal area 14 via contact opening 23, and may be structured wet-chemically to a printed circuit trace or to a terminal, the terminal pad extending, for example, in the direction of the center of the component. Thereby the substrate area needed for the production of the component and the latter's volume may be reduced, at savings in cost.

The sensor or actuator structures may be integrated together with an electronic evaluation circuit (not shown) into cap 1 and/or into structured layer 5.

The exemplary component described above may stand out as having a compact and robust design, which may permit the integration of a plurality of functional structures, and, at the same time, may permit adequate freedom of movement of the functional structures.

The exemplary method described above makes possible the production of a plurality of components requiring hermetically sealed encapsulation. In this manner, the effort or expenditure required for encapsulation and connecting surfaces may be reduced to a minimum.

The list of reference numerals is as follows:

1 cap
2 connecting layer
3 substrate
3a backside of substrate
3b upper side of substrate
4 connecting surface
5 structured layer having functional structures of a sensor
5a starting polysilicon layer
6 supporting element
6a first end of supporting element (supporting element)
6b second end of supporting element
6c passage of supporting element 7 deflectable functional structures of the sensor in structured layer 5
7a cavity
8 conductive connection
9 passage
9a wall surface
10 conductive layer
11 filler layer
12 metallic layer
13 printed circuit traces made of low-resistance polysilicon
14 terminal area
14a trenches or insulating trenches
15 frame
15a first end of frame
15b second end of frame
15c passage in frame
16 first sacrificial layer
16a areas of first sacrificial layer
17 second sacrificial layer
17a contact openings of second sacrificial layer
18 contact reed
20 oxide mask
21 recess forming a part of cavity 7a
22 dielectric layer
23 contact opening of dielectric layer
H gap height determined by total thickness of connecting layer 2 and depth of recess 21
K remaining thickness of substrate 3.

What is claimed is:

1. A micromechanical component comprising:
    a substrate;
    at least one structured layer on the substrate, wherein at least one functional structure is formed in the at least one structured layer;
    a cap covering the functional structure, wherein at least one cavity is formed between the cap and the at least one functional structure; and
    a connecting layer to connect the cap with the structured layer, wherein the connecting layer is formed by an anodically bondable glass having a thickness in a range of 300 nm to 100 µm.

2. The micromechanical component of claim 1, wherein the anodically bondable glass has a defined ion concentration.

3. The micromechanical component of claim 1, wherein at least one terminal area is formed in the substrate to externally contact the at least one functional structure, the at least one terminal area being electrically insulated from the substrate by an insulating frame formed by trenches.

4. The micromechanical component of claim 3, wherein the terminal area is formed by a part of the substrate, the substrate being doped such that the terminal area is low-resistance.

5. The micromechanical component of claim 1, wherein, between the substrate and the cap, at least one supporting element is provided in the at least one structured layer.

6. The micromechanical component of claim 5, wherein the substrate has a thickness between ca 80 µm and 150 µm.

7. The micromechanical component of claim 5, wherein the terminal area is positioned one of next to the at least one functional structure and below the at least one supporting element in the substrate.

8. The micromechanical component of claim 1, wherein the micromechanical component includes the substrate and the at least one structured layer, which is provided on at least one part of the substrate and is covered at least partly by the cap, and a conductive connection is provided between the cap and the substrate which extends all the way through the at least one structured layer and is positioned near a frame structure of the at least one structured layer.

9. The micromechanical component of claim 8, wherein the conductive connection is formed by a passage on whose bottom surface and wall surfaces a conductive layer is deposited, the at least one of the passage and the conductive layer being covered by at least one insulating layer on a side of the substrate opposite the at least one structured layer.

10. The micromechanical component of claim 3, wherein the terminal area is in contact with at least one printed circuit trace on a side of the substrate facing the at least one structured layer, and is furnished with a metallic layer on a side of the substrate opposite the at least one structured layer, at least one insulating layer being provided between the metallic layer and the substrate.

11. The micromechanical component of claim 1, wherein the cap, the substrate, and the at least one structured layer are made at least partially of a same material.

12. The micromechanical component of claim 1, wherein the thickness of the anodically bondable glass is in the range of 300 nm to 50 µm.

13. The micromechanical component of claim 2, wherein the anodically bondable glass includes at least one of alkali silicate and borosilicate.

14. The micromechanical component of claim 5, wherein the at least one supporting element is positioned largely in a center of the cavity.

15. The micromechanical component of claim 6, wherein the substrate has a thickness of ca 80 µm to 100 µm.

16. The micromechanical component of claim 9, wherein the at least one of the passage and the conductive layer is covered by at least one insulating layer on a side of the substrate opposite the at least one structured layer.

17. The micromechanical component of claim 11, wherein the same material is silicon.

18. The micromechanical component of claim 17, wherein the cap and the substrate are made of monocrystalline silicon and the at least one structured layer is made of polycrystalline silicon.

* * * * *

UNITED STATES PATENT AND TRADEMARK OFFICE
CERTIFICATE OF CORRECTION

PATENT NO.         : 6,876,048 B2
APPLICATION NO. : 10/066851
DATED              : April 5, 2005
INVENTOR(S)        : Fischer et al.

It is certified that error appears in the above-identified patent and that said Letters Patent is hereby corrected as shown below:

Column 8, lines 21-22, change "Subsequently, on backside 3a of substrate 3 is removed by a wet-chemical process." to --Subsequently, conductive layer 10, on backside 3a of substrate 3 is removed by a wet-chemical process.--

Signed and Sealed this

Thirteenth Day of March, 2007

JON W. DUDAS
*Director of the United States Patent and Trademark Office*